(12) United States Patent
Komiak

(10) Patent No.: US 9,007,124 B1
(45) Date of Patent: Apr. 14, 2015

(54) TILE ARRAY PA MODULE USING QUADRATURE BALANCED PA MMICS

(71) Applicant: BAE Systems Information and Electronic Systems Integration Inc., Nashua, NH (US)

(72) Inventor: James J. Komiak, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 46 days.

(21) Appl. No.: 14/028,978

(22) Filed: Sep. 17, 2013

Related U.S. Application Data

(60) Provisional application No. 61/701,886, filed on Sep. 17, 2012.

(51) Int. Cl.
*H03F 3/68* (2006.01)
(52) U.S. Cl.
CPC .......................................... *H03F 3/68* (2013.01)
(58) Field of Classification Search
CPC .......................................................... H03F 3/68
USPC .................................. 330/65, 66, 67, 68, 295
See application file for complete search history.

(56) References Cited

U.S. PATENT DOCUMENTS

| 4,901,032 A | 2/1990 | Komiak |
| 2002/0084852 A1* | 7/2002 | Cook et al. ..................... 330/286 |

* cited by examiner

*Primary Examiner* — Steven J Mottola
(74) *Attorney, Agent, or Firm* — Sand & Sebolt; Daniel J. Long

(57) ABSTRACT

A system for power amplification is presented. A tile array power amplifier (PA) module for use in a phased array includes a module with a radio frequency (RF) side and a direct current (DC) side, a top edge, a left edge a bottom edge and a right edge. Four PA dies are mounted in each quadrature of the RF side of the module. RF input connectors are mounted on the RF side to bring RF inputs to the PA dies. RF output connectors are mounted to the DC side to output amplified signals from the PA dies. The PA dies are formed, in part, with gallium nitride (GaN) and are mounted to the module in such a way that the tile array PA module is able to generate about 100 watts of RF power and dissipate about 200 watts of heat while amplifying signals over 10 GHz.

21 Claims, 5 Drawing Sheets

(RF SIDE)

FIG-2 (DC SIDE)

FIG-3 (RF SIDE)

FIG-4 (DC SIDE)

TILE ARRAY PA MODULE USING QUADRATURE BALANCED PA MMICS

CROSS REFERENCE TO RELATED APPLICATION

This application claims priority from U.S. Provisional Application Ser. No. 61/701,886, filed Sep. 17, 2012; the disclosure of which is incorporated herein by reference.

BACKGROUND OF THE INVENTION

1. Field of Invention

The current invention relates generally to apparatus, systems and methods for amplifying signals. More particularly, the apparatus, systems and methods relate to power amplifiers. Specifically, the apparatus, systems and methods provide for a tile array power amplifier (PA) module using quadrature balanced PA Monolithic Microwave Integrated Circuits (MMICs).

2. Description of Related Art

The prior art discloses the use of individual power amplifier module elements that can each separately be used to create a tile array power amplifier (PA) module. Currently the two module concepts for a PA phased array use either a brick construct which uses an ad hoc integration of elements, or the tile construct. The tile array is much more efficient in terms of size and weight compared to the brick module. However, prior art tile arrays have been limited by their size and therefore could not be used in confined areas such as in a fighter aircraft. Phased arrays have element to element spacing determined by the frequency of operation and, therefore, fitting all the circuitry horizontally in a tile array may be much more difficult than in a brick array where the module has an unlimited dimension of length that it can grow to. Therefore, there exists a need for a better tile array PA.

SUMMARY

The preferred embodiment of the invention includes a tile array power amplifier (PA) module for use in a phased array. The tile array PA module includes a radio frequency (RF) side and a direct current (DC) side, a top edge, a left edge a bottom edge and a right edge. Four PA die are mounted in each quadrant of the RF side of the module. RF input connectors are mounted on the RF side to bring RF inputs to the PA die. RF output connectors are mounted to the DC side to output amplified signals from the PA die. The PA die are formed in part with gallium nitride (GaN) and are mounted to the module in such a way that the tile array PA module is able to generate about 100 watts of RF power and dissipate about 200 watts of heat while amplifying signals over 10 GHz.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

FIGS. 1-4 illustrate the preferred embodiment of a tile array power amplifier (PA) module 1 that can be combined with similar tile array PA modules to form a much larger PA module. The tile array PA module 1 illustrated in FIGS. 1-4 is an improvement over prior art systems because it has four radio frequency (RF) power amplifier chips 3A-D mounted on a single module 5. The placement of components and the routing of each of these PA chips 3A-D is omitted for simplicity but should be noted that the placement of components and the routing of each of these PA chips 3A-D is in the preferred embodiment symmetrical about center line C1 and centerline C2 so that the geometries of these PA chips 3A-D as well as other components of the module 5 and the tile array PA module 1 itself are generally mirrored left-to-right and top-to-bottom.

Figure 2:
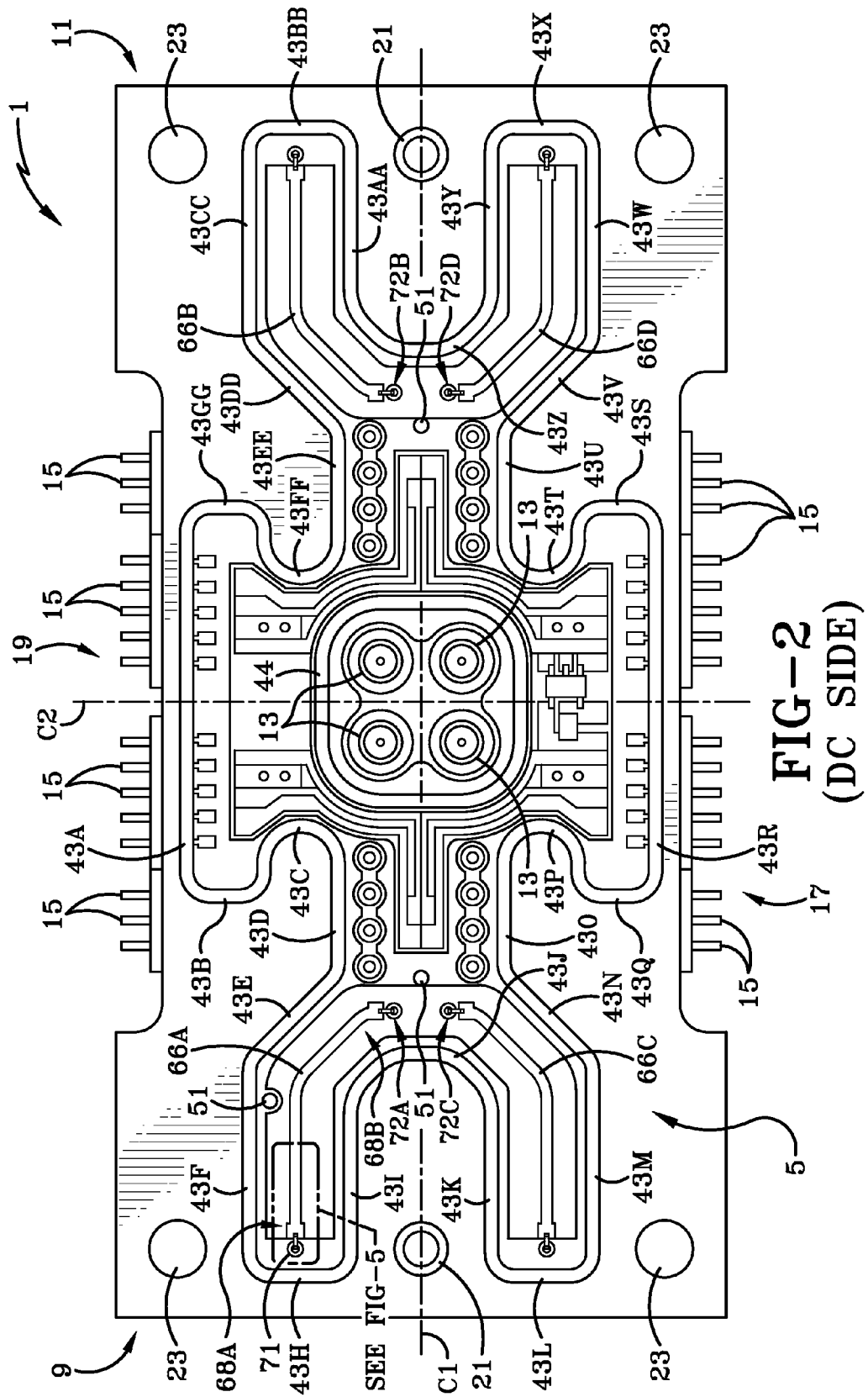
FIG. 2 illustrates a preferred embodiment of the DC side of the module holding four power amplifiers.

RF input connectors 7 are located near the left edge 9 and right edge 11 of the tile array PA module 1. RF output connectors 13 are grouped near the center of the tile array PA module 1 as best seen in FIG. 2. In the preferred embodiment, the RF input and output connectors 7, 11 are GPPO® types of connectors but they can be other types of connectors in other embodiments. Other multiple DC connectors 15 are located near the top edge 17 and the bottom edge 19 of the tile array PA module 1 that are used for other DC signals, control signals, and other signals. Threaded screw holes 21 and other holes 23 near the left edge 9 and right edge 11 can be used to combine the tile array PA module 1 other tile array PA modules to form a much larger tiled PA.

Those of ordinary skill in the art will quickly notice that input Lange couplers 25A-D (e.g., quadrature coupler) are used to couple the RF input signals to the PA chips 3A-D. Similarly, output Lange couplers 27A-D are used to couple the RF output signals from the PA chips 3A-D to the output connectors 13.

Figure 1:
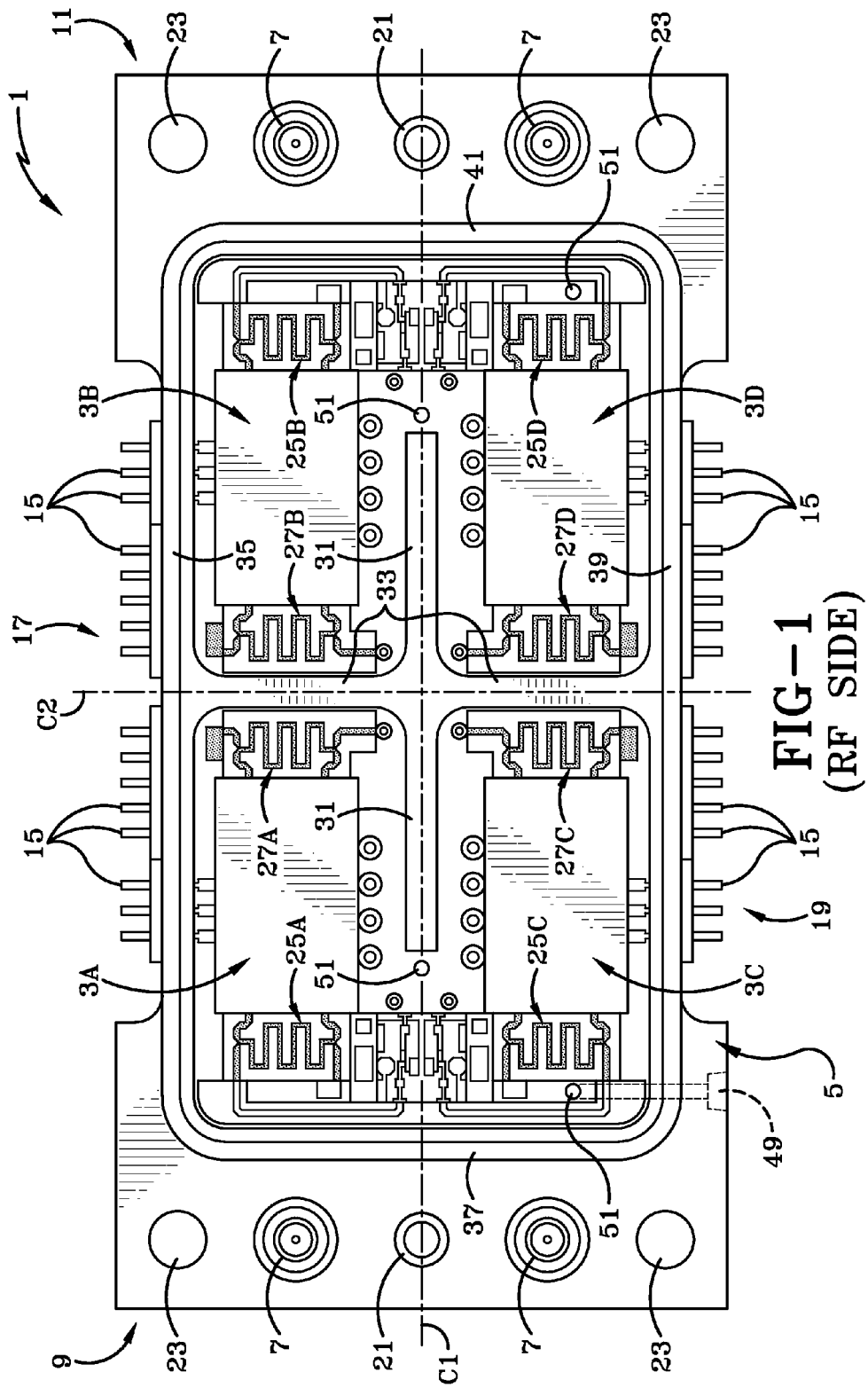
FIG. 1 illustrates a preferred embodiment of the RF side of a module holding four power amplifiers.

A horizontal septum 31 and a vertical septum 33 are arranged in a cross pattern as best seen in FIG. 1 to isolate the PA chips from each other. In the preferred embodiment, these septums 31, 33 are formed out of a metal. These septums provide shielding between pairs of diagonally placed PA chips 3A/3D as well as 3B/3C that feed a dipole so that they 180 degrees out of phase and have good amplitude isolation. The entire tiled array PA 1 is shield by a top shield wall 35, a left shield wall 37, a bottom shield wall 39 and a right shield wall 41. These four walls form a continuous outer wall that surrounds the four PA chips 3A-D and in the preferred embodiment these walls, 35, 37, 39, 41 are formed out of metal. Similar walls 43A-43GG are included on the DC side as best seen in FIG. 2 to also shield the DC circuits of the tile array PA module 1. A "rounded square" internal wall 44 is also formed around the RF outputs 13.

Figure 3:
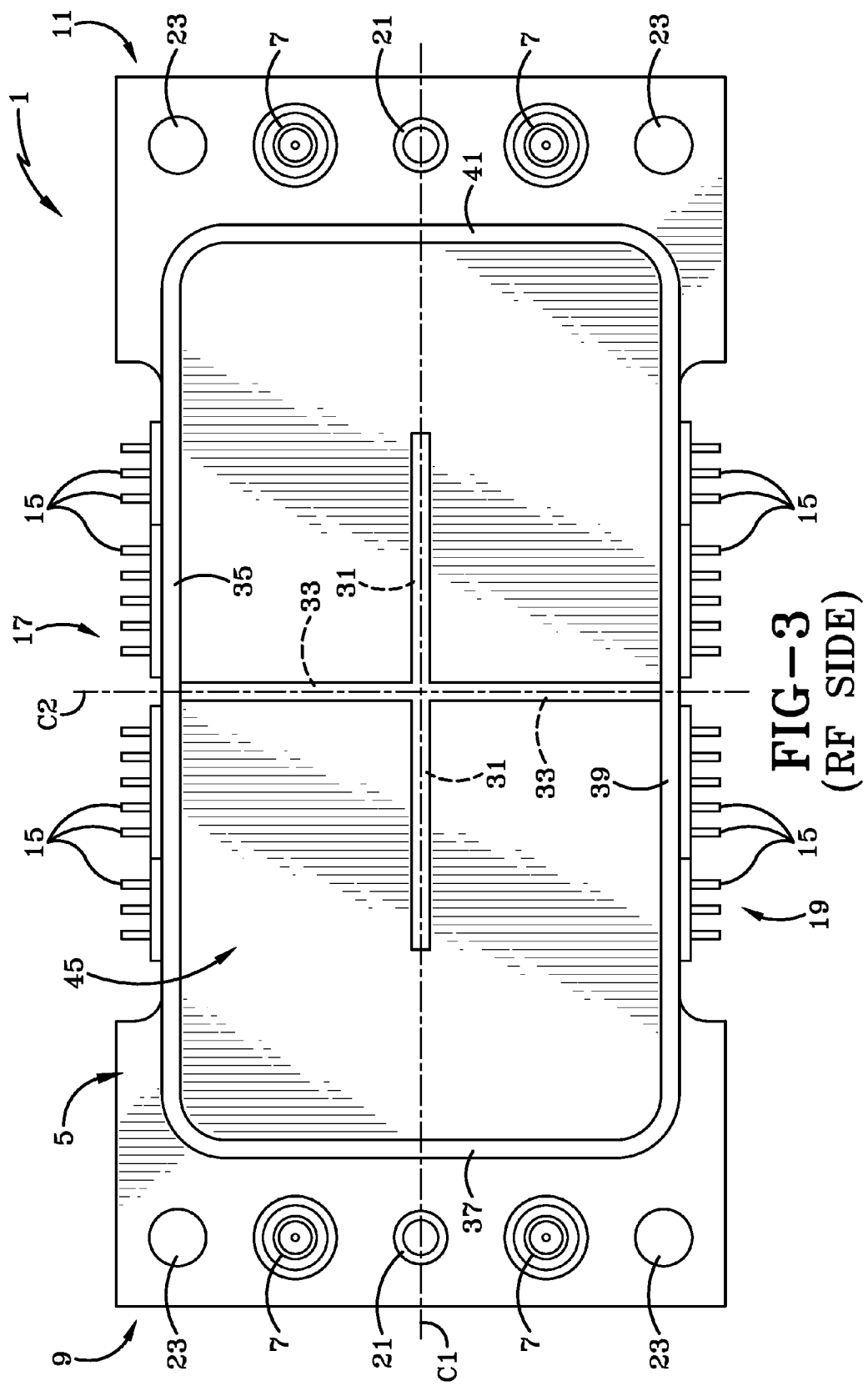
FIG. 3 illustrates a cover laser welded to the preferred embodiment of the RF side of the module.
Figure 4:
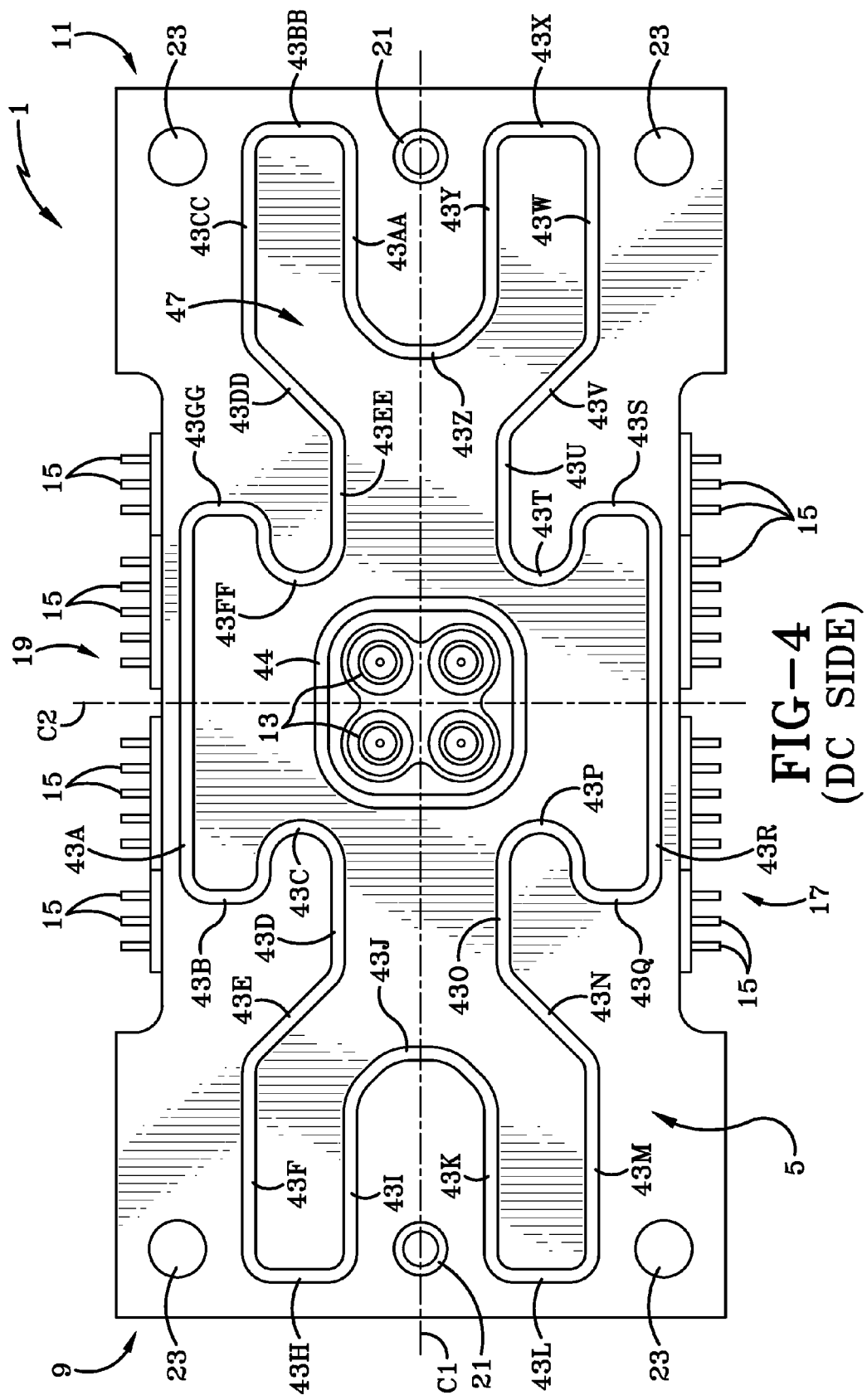
FIG. 4 illustrates a cover laser welded to the preferred embodiment of the DC side of the module.

FIGS. 3 and 4 illustrate the tile array PA module 1 with its covers in place. As illustrated in FIG. 3, an RF side metallic cover 45 is in the preferred embodiment laser welded to the septums 31, 33 and the top shield wall 35, the left shield wall 37, the bottom shield wall 39 and the right shield wall 41. Similarly, as illustrated in FIG. 4, a DC side metallic cover 47 is laser welded to the outside walls 43A-GG and internal wall 44. When both covers 45, 47 are welded in place, the tile array PA module 1 is a hermetically shielded assembly. The shielding walls and covers essentially provide for a waveguide below cutoff which provides isolation between the channels.

After the tile array PA module 1 has been hermetically shielded internal air can be extracted from the tile array PA module 1 through an access hole 49 (best seen in FIG. 1). A few bleed holes 51 are included between the front and back sides of the module 5 as illustrated in FIG. 1 so that air can be extracted from chambers in which the four PA chips 3A-D reside. After the air is removed, the access hole 49 and bleed holes 51 also provide a way of injecting a gas such as helium into the tile array PA module 1. After inert helium is back filled, the purge port 49 is sealed by laser welding a cover over the purge port 49. This allows the tiled array PA 1 to be used in harsh environments with its component completely sealed from the external environment.

Figure 6:
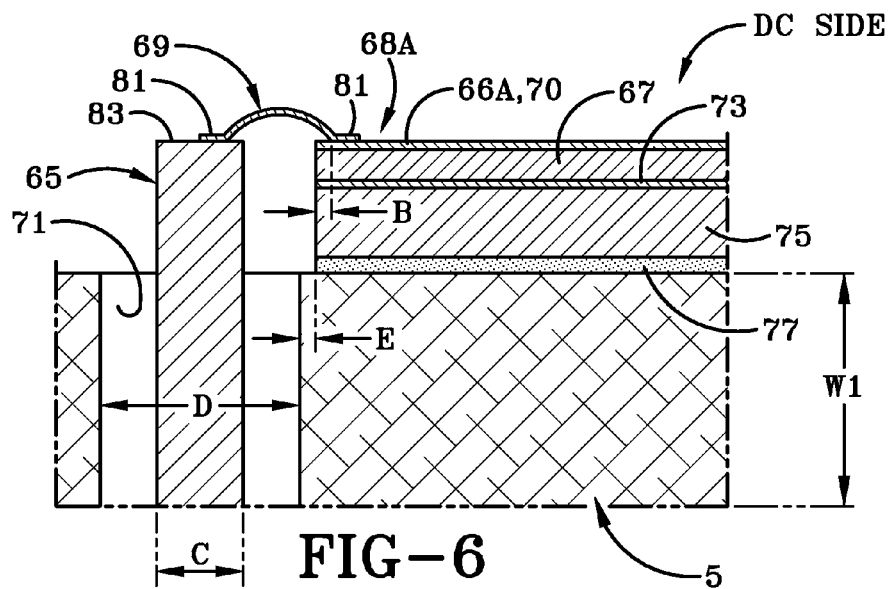
FIG. 6 illustrates a cross-sectional view taken from FIG. 5 of the jumper ribbon jumping from a central conductor to a transmission strip.

Another novel feature is how the RF inputs are received on connectors 7 on the RF side (FIG. 1) of the module 5 and then proceed downward toward the DC side (FIG. 2) of the module 5. As mentioned above, in the preferred embodiment, the input connectors 7 are GPPO® types of connectors. FIG. 6 illustrates how a center conductor 65 of the input connectors 7 reaches the DC side of the tile array PA module 1. In the preferred embodiment, the module thickness W1 is about 50 mils but it can be other thicknesses. The area 71 between the module 5 and the center conductor 65 can be filled with glass and in other configurations it can be fill with a gas such as helium. In the preferred embodiment, a layer of epoxy 77 is applied to the module 5 as illustrated. A carrier layer 75 is located above the epoxy layer 77. In the preferred embodiment, the epoxy layer 77 is about 2 mils thick and the carrier layer 75 is about 10 mils thick. A silicon layer 67 upon which the metal layers and other features that the DC side of the module 5 are created is attached to the carrier/spreader 75 with a solder layer 73.

Figure 5:
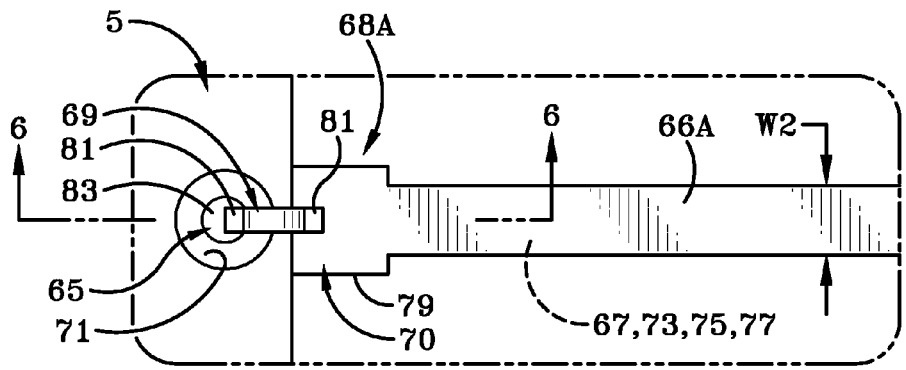
FIG. 5 illustrates a top view of a jumper ribbon jumping from a central conductor to a transmission strip that is an enlarged fragment of FIG. 2.

A metal transmission line 66A is created as best seen in FIGS. 5 and 6 on the silicon layer 67 that is elongated with a first end 68A and a second end 68B (both ends are seen if FIG. 2). In the preferred embodiment, the transmission line 66A has a width W2 of about 70 microns (um). The transmission line 66A can have a pad area 70 at its first end 68A that is square or rectangular in shape and a little wider than the width W2 of the transmission line 66A. In the preferred embodiment, an air bridge jumper 69 (e.g., ribbon bond) is created that spans from a bottom end 83 of the center conductor 65 to the pad area 70 of the transmission line 66A. The air bridge jumper 69 has an arch shape and has two connection pads 81 with one connection pad 81 electrically connected to the bottom 83 of the central conductor 65 and the other pad 81 electrically connected to the pad area 70 of the transmission line 66A. In the preferred embodiment, the air bridge jumper 69 is formed with gold and is about 0.5 by 3 mils in size but in other embodiments other metals and other sizes can be used.

In the preferred embodiment, there is a gap width B of about 2 mils between and the edge of the silicon layer 67 and the connection pad 81 of the air bridge jumper 69. Additionally, as illustrated there is a gap E of about 2 mils between the area 71 between the module 5 and the center conductor 65 and the epoxy and carrier layers 75, 77. The central conductor 65 is about 12 mils in diameter and there is about a 13.25 radius from the central conductor 65 to the module material 5.

In the preferred embodiment, the RF input signal enter the input connectors 7 on the RF side of the module 5 and travels downward to on the central conductor 65 to the DC side of the module 5. Next, the input signal makes a 90 degree turn traveling across the air bridge jumper 69 (e.g., ribbon bond) to the transmission line 66A. preferably the air bridge jumper is formed out of a metal such as gold. The RF input signals then travel on the DC side of the module 5 toward the second end 68B of the transmission line 66A. At the second end 68B of the transmission line 66A the RF input signal travels a from the transmission line 66A to a vertical upward central conductor site indicated generally by arrow 72A in FIG. 2. Similar sites for the other PA chips 3B-C are indicated by arrows 72B-D. At site 72A, the RE input signal again makes a 90 degree turn crossing from the transmission line over another air bridge jumper (e.g., ribbon bond) and onto a central conductor similar to the downward central conductor 65 discussed above. The air bridge jumper (e.g., ribbon bond) and central conductor are similar to the one in FIGS. 5 and 6 and are not discussed further here. The signal then travels vertically upward back up to the RF side of the module 5. At the RF side of the module 5, the RE signal again via another air bridge jumper (e.g., ribbon bond) makes a 90 degree jump from the upward central conductor onto circuitry on the RF side wherein it can then begin to be processed.

Figure 7:
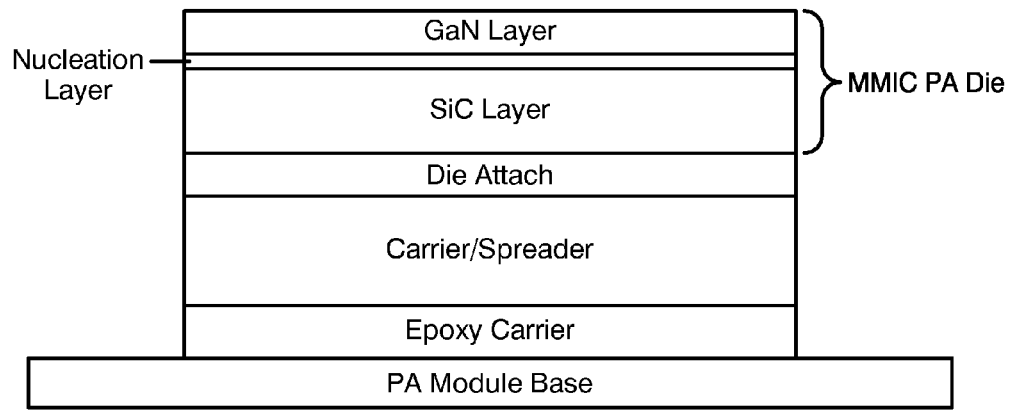
FIG. 7 illustrates an example stack of materials used to mount a gallium nitride (GaN) die to the module.

FIG. 7 illustrates the preferred embodiment of materials used to attach a GaN MMIC to the RE side of the module 5. One complete tile array PA module 1 is a relative small structure measuring about 1.5"×2.5'×⅜". This structure is novel in that it removes up to 200 watts of heat out of the monolithic power amp and into the module base (e.g., module 5) and then onto the cooling system of the phased array. In the preferred embodiment, the module 5 is aluminum and has a thermal conductivity coefficient of k=168 W/m-K and is about 0.165 inches thick. Similar, to FIG. 5, an epoxy carrier layer that has a thermal conductivity coefficient of k=6.0 W/m-K is placed on the PA module base (e.g., module 5). Next, a carrier/spreader layer is placed on the epoxy layer that has a thermal conductivity coefficient of k=147 W/m-K. A die attach with a thermal conductivity coefficient of k=59 W/m-K is placed on the carrier/spreader layer and the Monolithic Microwave Integrated Circuit (MMIC) is placed on top of the die attach. The GaN PA MMIC die includes a gallium nitride (GaN) layer about 1.8 micro-meter (um) think, a nucleation layer about 40 nanometers (nm) thick and an silicon carbide (SiC) layer about 0.004 inches thick. In the preferred embodiment, the epoxy layer is about 0.002 inches thick, the carrier/spreader is about 0.020 inches thick and the die attach is a 80/20 solder about 0.001 inch thick. A structure such as illustrated in FIG. 7 can generate and withstand at least 100 Watts of RF power and at least 200 watts of heat power. One of ordinary skill in the art will realize that in different embodiments, different materials could be used and they could be different thicknesses.

The related and co-owned U.S. Applications entitled "DIGITALLY CONTROLLED POWER AMPLIFIER," "METHOD OF OPERATING A POWER AMPLIFIER IN CLASS F/INVERSE CLASS F," and "CASCODE POWER AMPLIFIER," which are filed contemporaneously herewith, are incorporated as if fully rewritten.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A tile array power amplifier (PA) module for use in a phased array comprising:
   a module with a radio frequency (RF) side and a direct current (DC) side, a top edge, a left edge a bottom edge and a right edge;
   a first PA die mounted to the RF side of the module adjacent the top edge and the left edge;
   a second PA die mounted to the RF side of the module adjacent the top edge and the right edge;
   a third PA die mounted to the RF side of the module adjacent the left edge and the bottom edge; and
   a fourth PA die mounted to the RF side of the module adjacent the right edge and the bottom edge;
   a first RF input connector mounted on the RF side between the first PA die and the left edge configured to deliver a first RF input signal to the first PA die;
   a second RF input connector mounted on the RF side between the second PA die and the right edge configured to deliver a second RF input signal to the second PA die;
   a third RF input connector mounted on the RF side between the third PA die and the left edge configured to deliver a third RF input signal to the third PA die;
   a fourth RF input connector mounted on the RF side between the fourth PA die and the right edge configured to deliver a fourth RF input signal to the fourth PA die;
   a first RF output connector mounted to the DC side and configured to output a first amplified signal from the first PA die;
   a second RF output connector mounted to the DC side and configured to output a second amplified signal from the second PA die;
   a third RF output connector mounted to the DC side and configured to output a third amplified signal from the third PA die; and
   a fourth RF output connector mounted to the DC side and configured to output a fourth amplified signal from the fourth PA die.

2. The tile array PA module of claim 1 wherein the first RF output connector, the second RF output connector, the third RF output connect and the fourth RF output connector are arrange in a square pattern around a center position of the DC side.

3. The tile array PA module of claim 1 wherein the first input connector is an RE connector that has a cylindrical portion around a central conductor.

4. The tile array PA module of claim 3 further comprising:
   an input RF transmission line on the DC side extending from the left edge partially toward a center of the DC side, wherein the input RF transmission line has a left end and a right end with the left end near left edge of the module, where the central conductor extends downward from the RE side to the DC side with a bottom end of the central conductor adjacent but apart from the left end of the transmission line; and
   an air bridge jumper with a first end and a second end, wherein the first end is electrically connected to the bottom end of the central conductor and the second end is electrically connected to the left end of the transmission line.

5. The tile array PA module of claim 4 wherein the air bridge jumper is arch shaped with an elevated central portion that does not contact the central conductor nor the transmission line.

6. The tile array PA module of claim 4 wherein the air bridge jumper is formed out of gold.

7. The tile array PA module of claim 4 wherein the transmission line is between 40 and 100 micrometer (um) wide.

8. The tile array PA module of claim 1 where the air bridge jumper is first an air bridge jumper and wherein first RF output connector further comprises:
   an RF output central conductor that is elongated and located in the center of the first RF output connector, wherein the RF output central conductor passes upward from the DC side of the module to the RF side, wherein the RF output central conductor has a bottom end near the DC side; and
   a second air bridge jumper with a first end and a second end, wherein the first end of the second air bridge is electrically connected to the bottom end of the RF output central conductor and the second end of the second air bridge is electrically connected to the right end of the transmission line.

9. The tile array PA module of claim 1 further comprising:
   a top shield wall;
   a left shield wall;
   a bottom shield wall;
   a right shield wall, wherein the top shield wall, left shield wall, bottom shield wall and right shield wall form a continuous rectangular shaped wall around the first PA die, the second PA die, the third PA die and the fourth PA die;
   a vertical septum extending across a center of the module between the top shield wall and the bottom shield wall to shield the first PA die from the second PA die and to shield the third PA die from the fourth PA die; and
   a horizontal septum extending horizontally from the vertical septum partly toward the left shield wall at least partly shields the first PA die from the third PA die, wherein the horizontal septum additionally extends horizontally from the vertical septum partly toward the right shield wall at least partly shields the second PA die from the fourth PA die.

10. The tile array PA module of claim 1 further comprising:
- a top cover configured to cover the RF side of the tile array PA module;
- a bottom cover configured to cover the DC side of the tile array PA module so that the tile array PA module is hermetically sealed when the top cover and bottom cover are in place.

11. The tile array PA module of claim 10 further comprising:
- an access hole configured to provide for the extraction of air from the tile array PA module and to provide for the injection of a gas into the PA module; and
- bleed holes in the module to allow the gas to flow and cover the first PA die, the second PA die, the third PA die and the fourth PA die.

12. The tile array PA module of claim 1 further comprising:
- an access hole cover to cover the access hole so that the tile array PA module is fully seal shut with the gas.

13. The tile array PA module of claim 1 wherein the tile array PA module is rectangular in shape and is smaller than 2.5 inches by 4 inches by half an inch.

14. The tile array PA module of claim 1 further comprising
- an input folded Lange coupler between the first RF input and the first PA die; and
- an output folded Lange coupler between the first PA die and the first RF output connector.

15. The tile array PA module of claim 1 wherein the tile array PA module is configured to generate at least 100 watts of RF power and to dissipate at least 200 watts of heat.

16. The tile array PA module of claim 1 wherein the DC side is symmetrical about a horizontal centerline of the module and the DC side is symmetrical about a vertical centerline of the module, and wherein the RF side is symmetrical about a horizontal centerline of the module and the RF side is symmetrical about a vertical centerline of the module.

17. The tile array PA module of claim 1 wherein transistors in the first RF chip are formed in part with gallium nitride (GaN).

18. The tile array PA module of claim 1 wherein the first RE chip is Monolithic Microwave Integrated Circuit (MMIC).

19. The tile array PA module of claim 18 wherein the MMIC includes a gallium nitride (GaN) layer and a silicon carbide (SiC) layer with a nucleation layer between the GaN layer and SIC layer, wherein the MMIC sits on top of a die attach layer, wherein the die attach layer sits on top of a carrier/spreader layer, wherein the carrier/spreader layer sits on top of an epoxy carrier, and wherein the epoxy carrier layer sits on top of the module.

20. The tile array PA module of claim 18 wherein the tile array PA module is configured to amplify signals of over 10 Gigahertz (GHz).

21. A tile array power amplifier (PA) module for use in a phased array comprising:
- a module having a radio frequency (RF) side and a direct current DC side;
- a plurality of PA dies at least partially shielded from each other mounted on the RF side of the module;
- a plurality of RF input connectors on the RE side with one RF input connected to each of the PA dies, wherein a central conductor in each of the RF input connectors passed downward from the RF side to the DC side of the module;
- a plurality of transmission lines on the DC side;
- a plurality of air bridge jumpers connecting the central conductors of the RF input connectors with corresponding transmission lines, wherein central conductors in each of the RF input connectors, the air bridge jumpers and the transmission lines are configured to allow the RF input signals make 90 degree turns from the central conductor in each of the RF input connectors onto the transmission lines.

\* \* \* \* \*